(12) United States Patent
Rhysing

(10) Patent No.: US 11,073,546 B1
(45) Date of Patent: Jul. 27, 2021

(54) SMART INTER-CONNECTING CLAMP (ICC)

(71) Applicant: Rhysing Technologies, LLC, Troy, NY (US)

(72) Inventor: Daryian Rhysing, Troy, NY (US)

(73) Assignee: Rhysing Technologies, LLC, Troy, NY (US)

( * ) Notice: Subject to any disclaimer, the term of this patent is extended or adjusted under 35 U.S.C. 154(b) by 184 days.

(21) Appl. No.: 16/029,535

(22) Filed: Jul. 6, 2018

Related U.S. Application Data

(60) Provisional application No. 62/529,891, filed on Jul. 7, 2017.

(51) Int. Cl.
| | | |
|---|---|---|
| G01R 31/00 | (2006.01) | |
| G01R 31/50 | (2020.01) | |
| G01R 31/08 | (2020.01) | |
| G01R 1/07 | (2006.01) | |
| G01R 15/18 | (2006.01) | |
| H04Q 9/00 | (2006.01) | |

(52) U.S. Cl.
CPC ............ *G01R 31/008* (2013.01); *G01R 1/07* (2013.01); *G01R 15/186* (2013.01); *G01R 31/081* (2013.01); *G01R 31/50* (2020.01); *H04Q 9/00* (2013.01); *H04Q 2209/43* (2013.01); *H04Q 2209/47* (2013.01)

(58) Field of Classification Search
CPC .. G01R 31/008; G01R 31/025; G01R 31/081; G01R 1/07; G01R 15/186; H04Q 9/00; H04Q 2209/43; H04Q 2209/47
See application file for complete search history.

(56) References Cited

U.S. PATENT DOCUMENTS

| | | | | |
|---|---|---|---|---|
| 1,782,266 | A * | 11/1930 | Harding | F16B 2/065 24/279 |
| 7,216,862 | B2 * | 5/2007 | Walsh | B25B 5/068 269/166 |

(Continued)

OTHER PUBLICATIONS

Mr. Sullivan Thomas P, Harness integrity tester (hit), Jan. 24, 1986, U.S. Pat. No. 4959792A.

(Continued)

*Primary Examiner* — Douglas X Rodriguez
*Assistant Examiner* — Haidong Zhang
(74) *Attorney, Agent, or Firm* — Brown & Michaels, PC

(57) ABSTRACT

A device for securing aircraft wiring, monitoring the aircraft wiring, and detecting degradation of the aircraft wiring includes a first clamp body and a sensing device. The first clamp body has a first end, a second end opposite the first end, a concave portion extending semi-annularly between the first end and the second end, a first exterior surface, and a second exterior surface opposite the first exterior surface, the concave portion configured to at least partially define a wire-receiving space. The sensing device is adjacent the wire receiving space and is configured to sense a characteristic of the aircraft wiring indicative of integrity of the aircraft wiring. A wireless module can be configured to communicate data from the sensing device to a receiver. An electronics housing can support the sensing device and/or other electronics, and can releasably mate and fasten to the first clamp body.

19 Claims, 15 Drawing Sheets

(56) References Cited

U.S. PATENT DOCUMENTS

| | | | |
|---|---|---|---|
| 2008/0231289 A1* | 9/2008 | Ganesh | G01R 31/1272 |
| | | | 324/539 |
| 2017/0016947 A1* | 1/2017 | Polzer | H02H 1/0007 |
| 2017/0167635 A1* | 6/2017 | Desjardins | F16L 3/137 |
| 2018/0252749 A1* | 9/2018 | Elliott | G01R 15/16 |

OTHER PUBLICATIONS

Amphenol Corp, Monolithic thermoplastic p-clamp with cushion and locking mechanism, Dec. 14, 2015, U.S. Pat. No. 20170167635A1.
Amphenol Thermometrics Inc, Sensor and method of making a sensor, Feb. 21, 2013, U.S. Pat. No. 20140230545A1.
General Electric Co, May 3, 2002, Monitoring system and method for wiring systems, U.S. Pat. No. 6930610B2.
Amphenol Thermometrics Inc, Aug. 11, 2009, Battery cell with integrated sensing platform, U.S. Pat. No. 9054397B2.

* cited by examiner

SMART INTER-CONNECTING CLAMP (ICC)

CROSS REFERENCE TO RELATED APPLICATIONS

This application claims the benefit of Applicants' prior provisional application No. 62/529,891, filed on Jul. 7, 2017.

FIELD OF INVENTION

The technology relates to a method and apparatus comprised of a sensor within a smart clamp in an aircraft for collecting data about the wiring integrity and therefore, the novelty of a smart aircraft clamp for wiring harnesses. The smart clamp comprises a set of wireless sensors that transmit remote information to a data processing system. Furthermore, the device pertains to the general field of aviation manufacturing fastening devices, especially a clamp, and has certain specific application to aircraft electrical wiring. More particularly, the present technology relates monitoring and diagnostics while supporting and/or retaining such wiring bundles, as well as to obtain information through sensing elements from the wiring and other mechanical components such as tubing, piping or other equipment requiring a substantially circular clamp. Additionally, the device makes use of a novelty ergonomic hand tool for the disassembly of the embodiment herein.

BACKGROUND OF THE INVENTION

The sophisticated aircraft utilized by the U.S. Army, Navy, Air Force, Coast Guard, and Marines are equipped with multiple wire cables and harnesses. These cables are often comprised of over twenty parallel electrically insulated wires extending the length of the fuselage. The cables typically pass through bulkhead connectors and are secured to at least one structural support member in the fuselage or wings of an aircraft. Each end of a cable is provided with a connector. The connector contains pins or pin sockets each connected to one of the wires in the cable.

To detect wire failure in aircraft systems, either time or frequency domain reflectometry is currently used. Although these techniques allow identification and localization of wiring failures, they are unable to monitor degradation associated with aging of the insulation. Currently, degradation of insulation is mostly identified during visual inspection or when the aircraft is out of service. Their inability to predict wire failures and to identify the sources of damage may lead to accidents. The cost, both in terms of manpower and equipment involved in the conventional process of troubleshooting defective cables is substantial.

Adverse consequences of current inspection techniques include the expenditure of numerous man-hours for identifying sources of damage, as well as the unnecessary removal and replacement of equipment due to erroneous failure or prediction. Given the associated maintenance, time, and cost, there is a need for a reliable monitoring system and method for aircraft wiring that is capable of monitoring the degradation associated with the physical properties of the wiring during flight and before failure occurs.

When troubleshooting aircraft electrical wiring, conventional maintenance procedures dictate the removal of on-board control units associated with the electrical system. The control units are transported to a maintenance facility for testing. If the on-board control units are fully operational, then the faulty wire is removed, spliced, or replaced by a trained technician. Harnesses in aircraft may have anywhere from 2 miles to over 50 miles of wiring. Aircraft are comprised of numerous subsystems which are in constant communication with one another. These wires are held in place using a metal clamp with a rubber sleeve that is then bolted to a frame or some other surface.

Through the continual motion of the aircraft and the use of chemicals, such as hydraulic fluid, oils, or washing detergents, the wire bundles may chafe and the rubber sleeve may erode and expose the wires to the sharp metal edge of the clamp. Due to limitations and the dangers inherent with the current design, it would be highly desirable to provide a method and apparatus for testing the integrity of aircraft cables which would not require disconnection or removal and depot testing of on-board aircraft control units. There is a need for a secure monitoring and diagnostics apparatus that would be inexpensive in use and manufacture and would reduce the occurrence of Repetitive Strain Injuries (RSI) among the workforce when replacing all the clamping devices.

Existing clamps are metal or nonmetal covered by a rubber component for improved grip. These clamps use hardware and are difficult to install around one or more longitudinal elements, like bundles of wires, tubing, or other similar materials. However, these clamps are hard to install and they have led to severe strain injuries of the hands, such as carpal tunnel syndrome. One model of a clamp made by Amphenol has a hinge making this process less difficult and faster, nevertheless, it continues to use hardware for installation affecting the strain injuries among the workforce. Additionally, these clamps do not have sensors that can monitor the wiring physical characteristics such as degradation over time. Consequently, there is a need for a smart clamp that is lighter and does not use hardware for installation, but still capable of providing a strong and reliable inward force and circumferential grip around components to be secured and provide information of wiring integrity. Furthermore, there is a need for a smart clamp with a slide channel for improved grip assembly and easy replacement, a one size that can fit grips of different diameters so that a damaged grip can be switched to accommodate more or less wires without the need to dispose of the clamp itself. Such clamps with interchangeable grips and different sensing devices may also allow for easy replacement of material and potential reduction of Repetitive Strain Injuries (RSI), such that each smart clamp offers multiple options for a user.

The current clamp in use is a metal clamp used to hold bundles of electrical wires and fuel lines. There are inherent problems with the material and the design of this original clamp, the material is conductive and can lead to arcing, and the design requires the technicians to pull it apart causing injuries to the hands. Additionally, the need for a bolt/screw, washer, and nut to attach the clamp to the aircraft opens up for the possibility of Foreign Object Damage (FOD). Furthermore, the current clamp is not able to withstand technician misuse, such as stepping on the wires since it will cause the metal strip to bend and deform adding stress in the wire bundle that is trying to secure.

Batteries are included in various applications, such as those applications that rely on RFID tags and electrical signal transmission. Such applications generally require that the battery not only outputs power on the scale of about 3V to 5V, but also retain favorable performance characteristics such as longer cycle life, increased robustness, and improved reliability. These demands are usually met by using a flat 3.7V battery. The design of a wireless and battery free sensor is difficult due to the balance between maximizing efficiency and reliability, while retaining the necessary power output, and other performance characteristics of the sensor.

The sensor must be retained in place in order to provide measured outputs. Conventional methods for mounting a sensor to a plastic overmolding include welding and/or screwing a sensor housing in place which results in other disadvantages such as increased time and expense for placing the sensor into operational use. The current detectors used on existing circuits without need for disconnection and are able to interact with the magnetic fields generated by a current carrying conductor are handheld devices often referenced to as clamp-on-ammeters, such as in Fluke's applications. These clamp meters interact with the magnetic fields generated by current to get an accurate measure of the current after a calibrated conversion. These clamp meters sum up the currents in the wires that they enclose with currents that go in opposite directions having opposite signs in the summation. For example, if there are two conductors that have the same current, but in opposite direction, the clamp meter will read zero net current. If one conductor has half the current as the other in the opposite direction, the clamp meter will read the half level current. If there is only one current carrying conductor, the clamp meter will read the current in that conductor.

Most wires that are enclosed by the aircraft clamps have multiple conductors in them that may have current flowing in different directions, such that there would be current between the feed and the return conductors. There is a need to measure this difference caused by a leakage current. The leakage current can be caused by the actual wires when insulation becomes worn and damaged, because the current can flow out of the circuit. The discussion herein is merely provided for general background information and is not intended to be used as an aid in determining the scope of the claimed subject matter.

SUMMARY OF THE EMBODIMENTS

The subject matter disclosed herein relates to clamping sensors, in particular, to a method and apparatus for mounting a sensor housing to a component that incorporates features for sensing in-situ characteristics and parameters. The smart clamp is a mechanical device used in the art to secure components. More particularly, the smart clamp is used to hold or tightly secure objects together, in order to prevent their movement or separation by application of an inward force. For example, in U.S. Provisional Patent Applications 2017/0167635A1, 1,782,266, and 7,216,862, the clamp is generally designed as a metal clamp or plastic produced from a single long piece. The single piece is bent into a form comprised of a circular arc, with the opposite ends of the piece coming together to close the circular arc. The end pieces of the clamp are fastened together using a screw or bolt.

Briefly, in accordance with one of many embodiments of the present device, a monitoring and diagnostics system is provided, which includes at least one sensor. The sensor is configured to monitor a component of an aircraft wiring system and to acquire a monitoring signal. A method embodiment for monitoring an aircraft wiring system is also provided. The method includes acquiring a number of monitoring signals for a number of aircraft wire harnesses using a number of sensors. The method further includes conveying the monitoring signals from at least one of the sensors to a data acquisition system. In some aspects, the sensors operate remotely and battery-free through energy harvesting, to lessen negative effect on the environment.

The device is designed as two halves made of thermoplastics and comprised of one or more complementary snap-fit tabs that interlock together and rest flush against one another in a manner that lines up one half with its respective complementary snap-fit tab or tabs with the hole of the second half with secondary complementary snap-fit tab or tabs, FIGS. 2, 19, 20, and 27. The securing device may include a grip to improve the securing functionality of the device, FIGS. 17, 30, and 31. The technology is also a housing that encloses a sensing device, FIGS. 2, 3, 19, 21, and 22. The device may operate with or without a battery cell. The technology comprises sensing elements and a platform configured to provide information about in-situ characteristics and parameters of the wiring integrity. Embodiments of the battery and sensor casing can have the sensing elements or platform integrated into the structure of the grip or as a separate structure incorporated into the device assembly and combinations thereof, FIG. 20. The sensing unit comprises of at least one sensing layer responsive to properties of the wiring harness.

The smart clamp sensors address causes for wiring degradation using full passive RFID sensor tags for fault localization, fluid contamination by proximity to liquids or metals, moisture, including water vapor detection, sensing of wet material when wetness causes loss or deterioration to mold or corrosion, and detection of leaks in hard-to-access locations. Furthermore, the smart clamp may comprise additional sensors, for example, sensors for gas detection, metal detection, pressure detection, temperature detection, and amperage detection. Since an energy harvesting system is one of the options chosen to power the sensors, the transmission rate is largely based on the charge time that is possible with the ambient source chosen. The safety constraints are minimal considering there will be a small amount of electrical energy held in the circuit at any given time due to the nature of the energy harvesting system.

The device is therefore an object of the exemplary embodiments disclosed herein to alleviate the disadvantages in the art and provide a smart interconnecting clamp that is molded from a combination of thermoplastics and rubber components in order to provide a lightweight but sturdy circumferential clamping device as well as a level of security of the protocol through the communication system. The disassembly tool, FIGS. 7, 8, 9, 23, and 34, fits easily into a hand fingers to reach areas and allows the technician to depress the snap-fits of the smart clamp with one hand and without much use of force.

The tool is able to depress the snap-fits of the smart clamp at least 0.04 inches. This is the minimum distance required to fully depress the snap-fits beyond the retaining wall, thus allowing the two halves of the smart clamp to disengage from each other. Additionally, the disassembly tool is comprised of a feature to allow the electronics compartment to be removed from the smart clamp if location of the sensing device is external to the main embodiment, FIGS. 7, 12, 20, 21, and 22. The disassembly tool can withstand up to 26 pounds of stress. More than 26 pounds will exceed the compressive strength of one of the materials choice, PMMA, when exposed to technician misuse, such as when stepped on directly. This is a scenario that is very likely to occur when the technicians are installing the smart devices and may drop the tool without realizing while accidentally stepping on it.

The disassembly tool is comfortably designed to be used over an extended amount of time. Therefore, the finger holes on the tool are spaced so that it would not constrict a technician's finger even if they were using gloves. To prevent the tool from becoming FOD should it be dropped, a technician could secure it to their person through a small loop that may accommodate the addition of a keychain or tether, FIGS. 8, 9, and 34.

In one aspect of the technology, the securing device is designed as a half embodiment comprised of one or two snap-fit tabs and one or two apertures to fit the snap-fit tabs of a second half embodiment, FIGS. 2, 27, 35, and 37. In such design, the top body terminates in a first complementary snap tab and may have an aperture to fit an opposite snap-fit tab or not, while the bottom of the component may terminate in a second complementary snap-fit tab or an aperture to fit a second half embodiment accordingly. The first complementary tab fits in a second half body's depression and forms a locking support as a latch, FIG. 4. The first complementary tab and the second complementary tab interlock together and rest flush against one another in a manner that lines up the hole of the first complementary tab with the hole of the second complementary tab.

The Electronics Compartment (EC), FIGS. 20, 21, and 22, may house the electronics externally to the clamp or grip. The EC is added to the smart clamp assembly. One aspect of this embodiment has a set of snap tubes that provide a connection to the smart clamp. The snap tube design helps with the prevention of FOD as the EC would be securely fastened to the smart clamp. The snap tubes would connect as shown in FIG. 20, and would need to be removed with the disassembly tool as shown in FIG. 11. Another important design of one of the embodiments is the ability of the technician to access the electronics. This is accomplished by the use of a lid that revolves around a hinge, FIG. 13.

Different materials are chosen for the embodiments. For example, one of the materials chosen for the base material of the smart clamp is PMMA because it is safe and nontoxic. PMMA has been deemed to have a low smoke point and meets FAA flammability requirements, following the study of its phenomenological properties by avoiding breaking down into combustible fumes. Fluorosilicone overmolded is another materials chosen and may be used on the grip with a moderated hardness to reduce the wear on the wires by the clamp. The extreme temperature that the smart clamp material would need must provide a low brittle transition temperature and liquid oxygen compatibility to avoid shattering upon vibration and creating FOD. Fluorosilicone is chosen because it can be easily colored to help technicians notice which sensor is alerting failure.

In another aspect of the invention, the securing device encloses a grip, FIGS. 30*a*, 30*b*, and 31. The grip may be made up of a latex polymer or elastomer, a synthetic polymer, or any combination thereof. In yet other aspects of the invention, the internal face of the grip is ribbed or grooved in order to compress more easily, form a better grip, and/or accommodate multiple diameters of wiring bundles. In yet other aspects of the invention, the holes through the top and bottom of each half embodiment corners are inserted to allow for better fastening using a strap tie, FIG. 24.

Other aspects of the device also include a grip that additionally has an outer grove that sits flush against the interior surface or channel of the opposite side of the grip when the securing device is interlocked. The smart clamp has a thermoplastic housing that encloses a sensing device. An overmolding made from an electrically non-conductive material may be enclosed as a grip instead of a slide and fit through channel strip. In another embodiment, a sensing device is enclosed inside the smart clamp that may include an electrically non-conductive overmolding covering the sensor, FIGS. 17 and 19.

Unfortunately the construction of smart clamp sensors is sensitive to local changes in geometry, as well as to localized forces that act on the structures of the smart clamp itself. Moreover, since the sensors are often being optimized for size, there is typically very little space between the sensors for any type of battery structure, let alone those that have expansive three-dimensional characteristics. Thus, in order to gather any information about the operating characteristics of the wiring without disrupting or disconnection, discrete wireless with battery or battery free sensors may be located inside the smart clamp housing or in the edges of the grip. For example, the constraints limit the available number of sensors to one (1) for every smart clamp. Therefore, each smart clamp may hold one (1) different sensing device.

There is no current information on wiring integrity that is gathered from the current generation of clamps. Therefore, the smart clamp is a unique solution and novel in its design. The smart clamp, for example, may include a temperature sensor in the interior edges of a grip since positioning the sensor on the exterior of the clamp could lead to inaccurate measurements. Therefore, there is a need for a smart clamp with improved sensing characteristics. It is also desirable that this smart clamp comprises, or is compatible with Artificial Intelligence sensing software interpretation for monitoring and data gathering so as to provide and enrich the understanding of the operating parameters of the wiring bundles and the overall integrity of the electrical systems.

This brief description of the invention is intended only to provide a brief overview of the subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

A more complete appreciation of the invention and many of the attendant advantages thereof will be readily obtained as the same becomes better understood by reference to the following detailed description of the invention by reference to certain embodiments when considered in connection with the accompanying drawings.

It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which:

FIG. 33 illustrates a portion of a smart clamp mount with pressure fastener;

DETAIL DESCRIPTION OF SPECIFIC EMBODIMENTS

Figure 3:
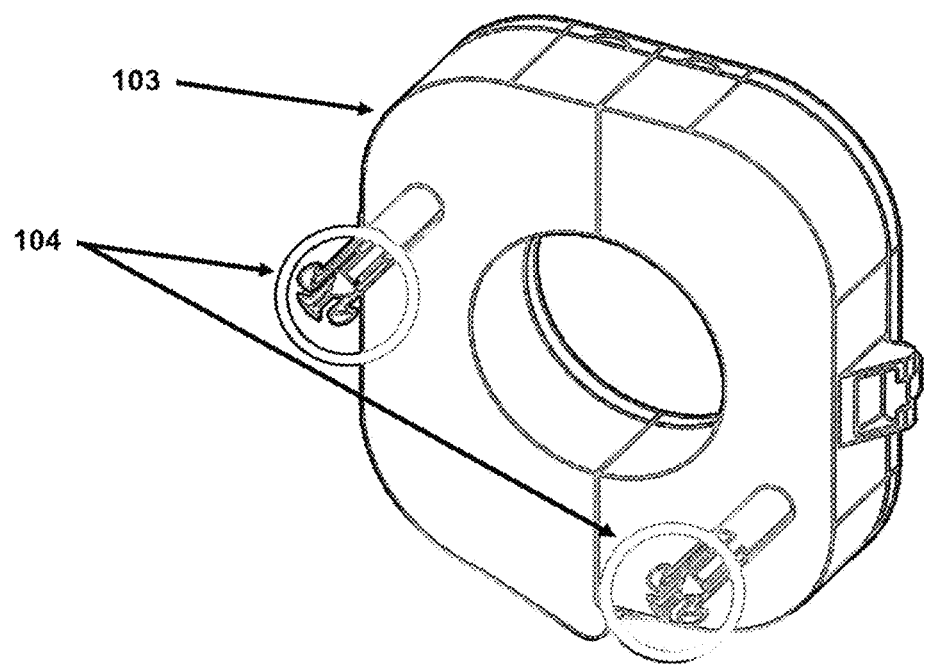
FIG. 3 is an electronic compartment with tubular snap fits for mounting unto smart clamp.

The smart clamp 100 is an efficient tool to enable testing of the wiring integrity in tight spaces where other hand tools cannot reach. Because there is minimal manual or physical force required, the smart clamp design reduces the risk of Repetitive Strain Injuries (RSI) that can occur with monotonous hand crimping. The smart clamp offers a reliable method for detecting wiring defects before they become faults. Given that the smart clamp is already securing the wire bundles, they become a useful automated device for ensuring the integrity of electrical systems. The function of the smart clamp is:

- to detect aging effects on wiring through the interconnection system provided by the smart clamp
- to provide data regarding failure characterization and diagnostics
- to identify wiring system failure mechanisms and degradation processes
- to check robust insulators and conductors for contamination, degradation over time, metal shavings from repairs, exposure to fluids, Ph levels and physical properties of the insulation such as washing solutions or hydraulic fluids
- to detect physical abuse such as stepping on the wire bundle
- to detect changes in the physical and chemical properties of insulation such as flexibility, hardness, tensile strength, compressive strength, and torsion strength
- to detect environmental effects that include temperature, humidity, and solar exposure The smart clamp 100 is a non-destructive interconnecting device for wiring systems that could become an integral part of the aircraft to continuously monitor and locate wiring faults and wiring defects. The smart clamp is light and nonmetal in situ inspection technology for aircraft wire integrity. It consists of uniquely identifiable electronic modules that monitor the signals within aircraft wiring without the need for disconnection. The smart clamp monitors the wiring signal information and stores the data into a database. The use of the smart clamp enables real-time inspection of wiring integrity. The data can determine schedule maintenance and statistical analysis of aircraft wiring by the use of a microelectronic module with integral software to process data generated by the built-in sensors housed within the smart clamp, grip, or external electronic compartment unit, FIG. 3, which surrounds the wire bundle. The smart clamp may contain many sensor functionalities, for example, it may contain a programmable solid state sensor with arc detection and damaged wire detection/locator module.

The following is a detailed description of exemplary embodiments to illustrate the principles of the invention. In describing an embodiment of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several embodiments of the invention are described for illustrative purposes, it being understood that the invention may be embodied in other forms not specifically shown in the drawings. Therefore, the embodiments are provided to illustrate aspects of the invention, but the invention is not limited to any embodiment. The scope of the invention encompasses numerous alternatives, modifications and equivalent. Numerous specific details are set forth in the following description in order to provide a thorough understanding of the invention. However, the invention may be practiced according to the claims without some or all of these specific details. For the purpose of clarity, technical material that is known in the technical fields related to the invention has not been described in detail so that the invention is not unnecessarily obscured.

Mechanical Component

Figure 1:
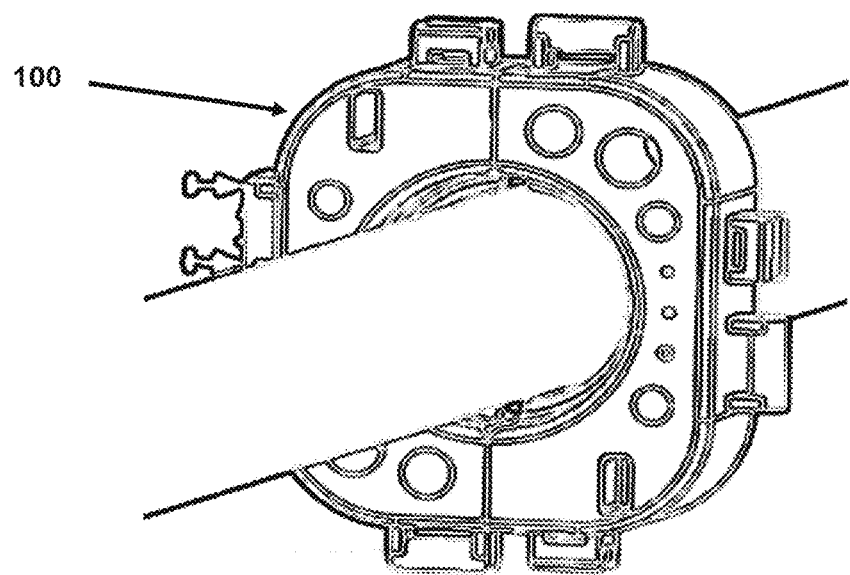
FIG. 1 is a diagram of an exemplary smart clamp assembly.
Figure 2:
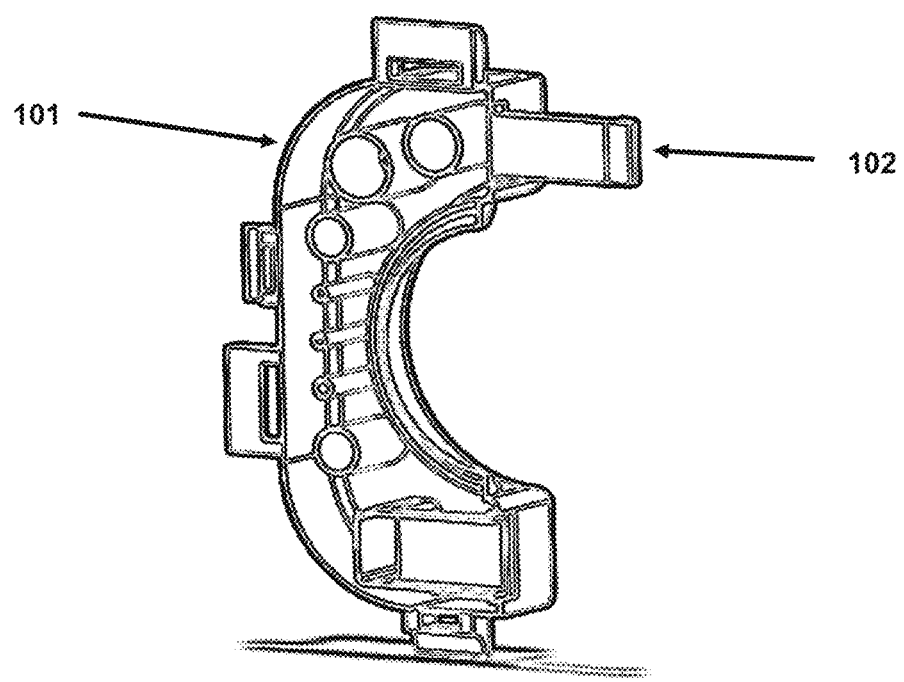
FIG. 2 is a diagram of a half assembly cross-section of a smart clamp that illustrates the interior for housing a sensor.

FIG. 1 illustrates an overview of an embodiment. It is a one-quarter view of a smart clamp assembly 100 in accordance with one of many exemplary embodiments of the device. The fastening mechanism is a smart clamp having a semicircular plastic body, FIG. 2, which has an inner face and an outer face. The semicircular plastic body is further comprised of a curved body channel, one or two complementary snap-fit tab assemblies 102, and a second semicircular plastic half that may or may not be identical to the first half assembly 101.

Figure 7:
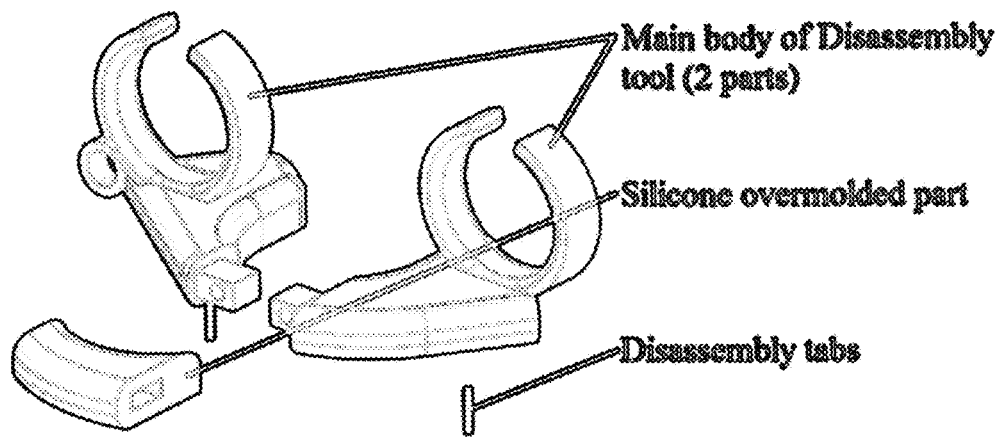
FIGS. 7, 8, and 9 show views of an exemplary disassembly tool embodiment of the securing smart device.
Figure 8:
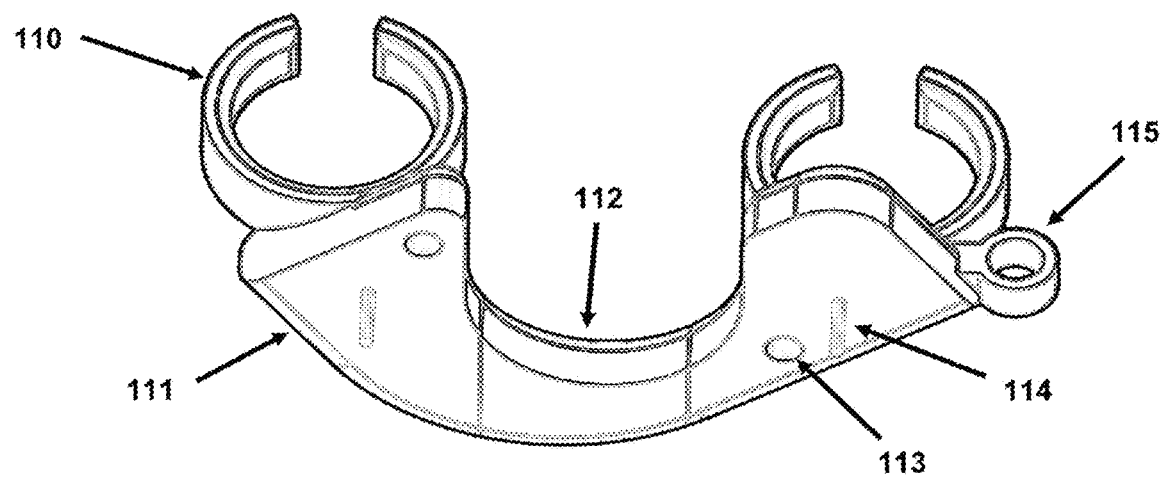
Figure 9:
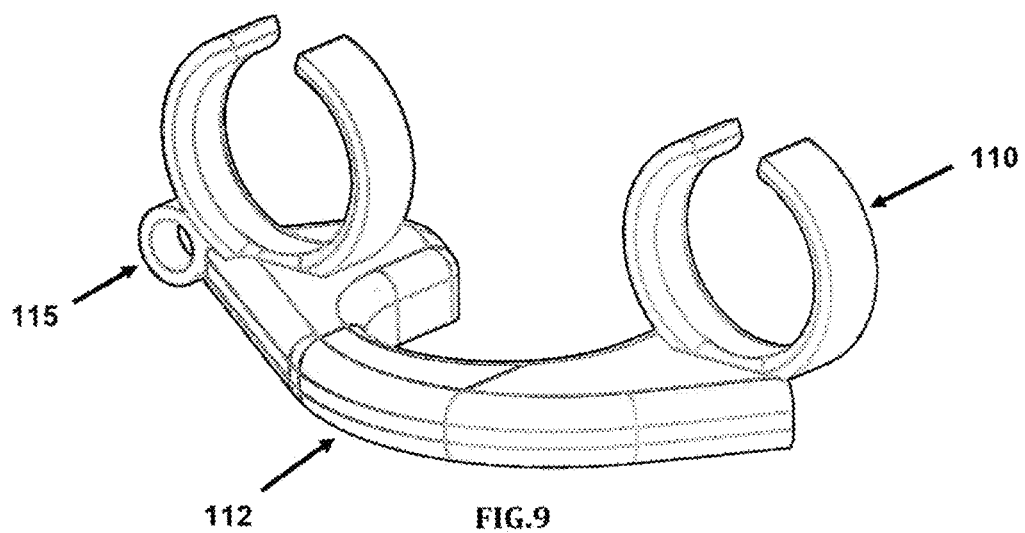
Figure 10:
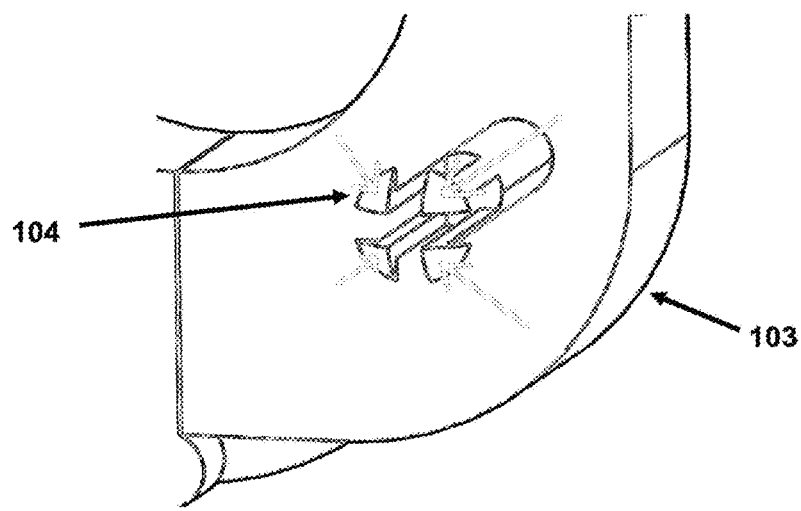
FIGS. 10, 11, and 12 show views of an exemplary disassembly tool method of use for releasing the securing tubular snap fit tabs from the electronic compartment.
Figure 11:
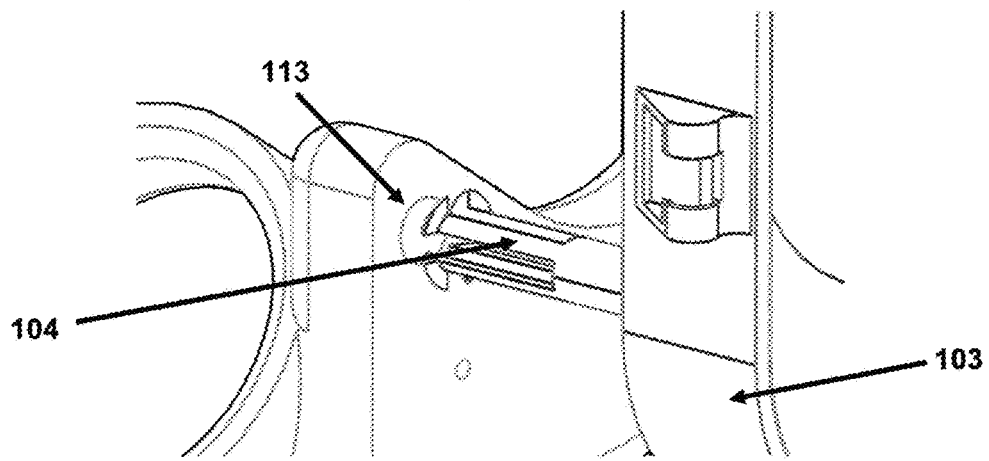
Figure 12:
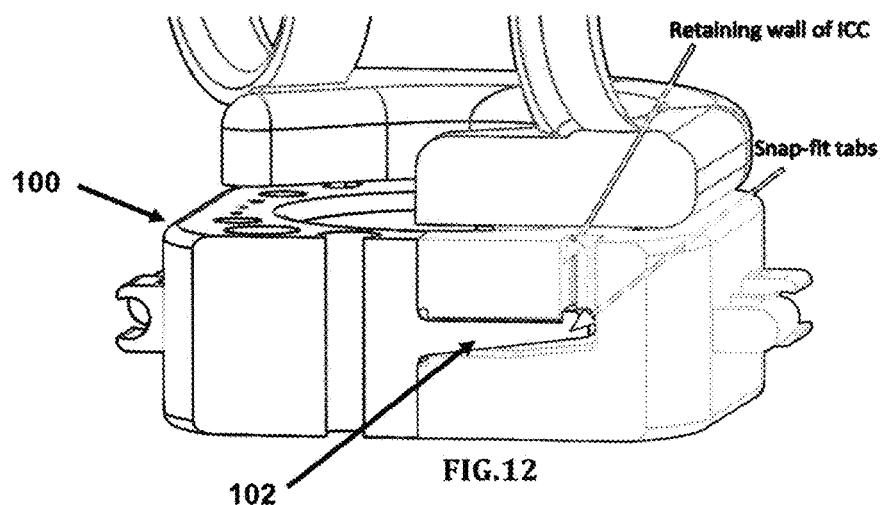
Figure 13:
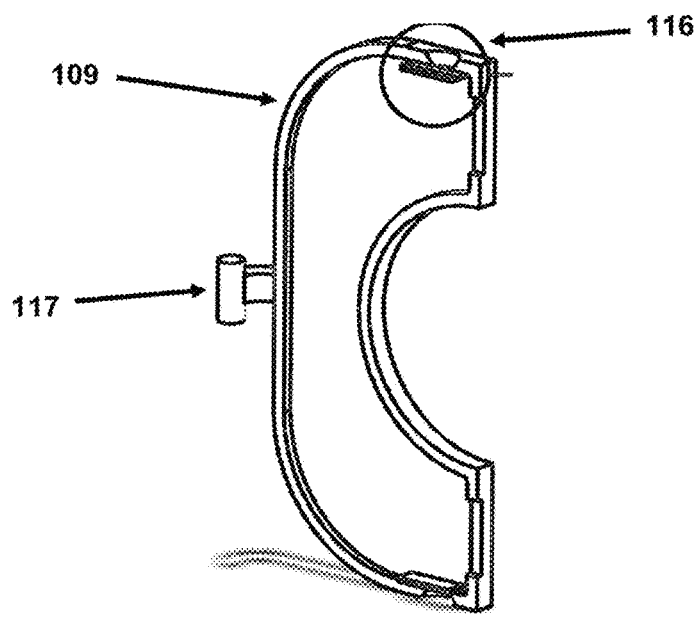
FIG. 13 illustrates a lid used to secure the electronic compartment.
Figure 27:
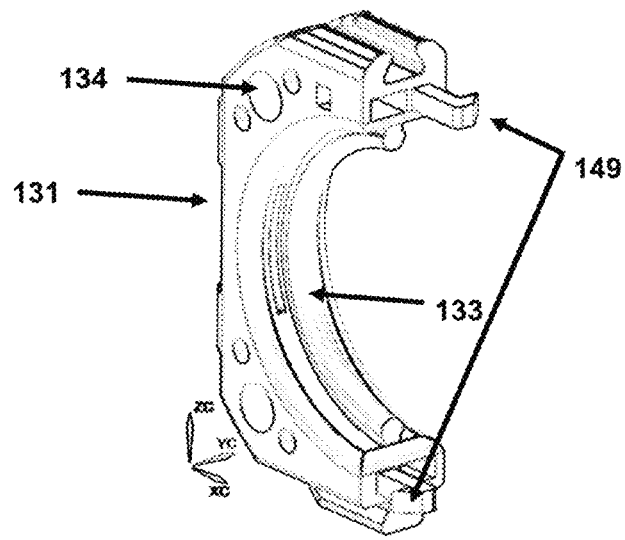
FIGS. 27 and 28 illustrate the grip channel from a half smart clamp embodiment.

The plastics used in the smart clamp are advantageous over metallic securing devices because they are lighter, easier to install, easier to bend, and retain equivalent securing strength. The curved body portion of the smart clamp 101 is further comprised of a first end top portion and a second end bottom portion opposite the first end top portion. The top portion is operably attached to the first complementary snap-fit tab assembly 102. The bottom portion may be operably attached to a second complementary snap-fit tab assembly or may not have a second complementary snap-fit tab assembly, FIGS. 19, 20 and 27. The top portion and the bottom portion of the curved body may be integrally formed with the first complementary snap-fit tab assembly and the lower snap-fit tab assembly 149, respectively. The tabs 114 on the disassembly tool, FIGS. 7 and 8, are able to depress the snap-fits in some way so as to allow the clamp halves to come apart. The disassembly tool is comprised of a feature to allow the electronics compartment 103 from FIG. 11 to be removed from the smart clamp if location of the sensing device is external to the main embodiment. Additionally, the disassembly tool is made to fit the average fingers of a technician through finger loops 110 that easily accommodates to the hand. To prevent the tool from becoming loose, a technician could secure it to their person through a small loop 115 that may accommodate the addition of a keychain or tether.

The top and bottom portions with complementary snap-fit tab assemblies 102 or 149 are comprised with a locking support 145a and 145b in the form of an aperture that is drilled, machined, or molded through the smart clamp assembly. The locking support 105 projects inward from the edge of the surface. In certain embodiments, the snap-fit tabs may appear to have a wedge-like shape 102 and 149. Alternative embodiments may have locking support or snap-fit tabs at a front portion that terminates in a latch forward and outward from a side of the semicircular smart clamp surface.

Figure 24:
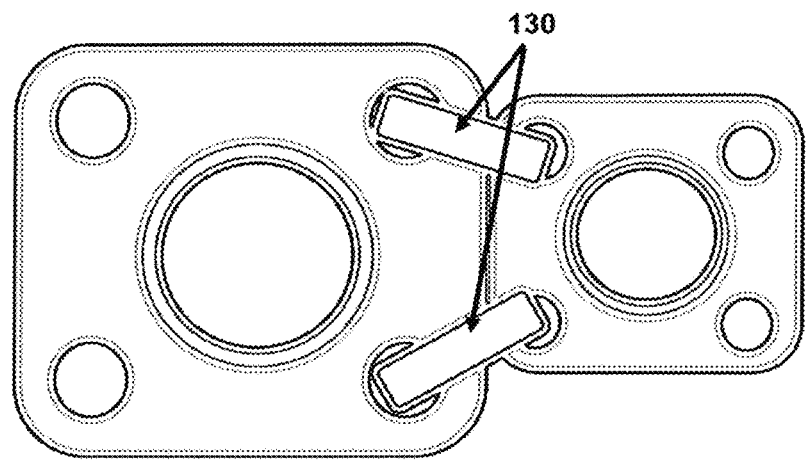
FIG. 24 is a diagram that illustrates how strap ties can be used through the smart clamp openings.

A hole 146a or 146b is drilled, machined, or molded through the smart clamp surface to latch the complementary snap-fit tabs. Additional holes 134 are designed to accommodate a strap tie 130, or other fastener, FIG. 24. An external housing device 106 can accommodate an oversized sensor and may incorporate snap-fit fasteners 104 for more effective fastening. The holes may be of a variable diameter, depending on the type of fastener used. Exemplarily, a second sensing housing assembly 126 can fasten a device that may sit upon the first clamp assembly 127 such that a common fastener may pass through the holes of the first clamp assembly, FIG. 20. It will be readily apparent to one of ordinary skill in the art that the hole may be of any shape that can accommodate a fastening device such as a strap tie, snap-fit tab 104, or pressure fastener.

Figure 28:
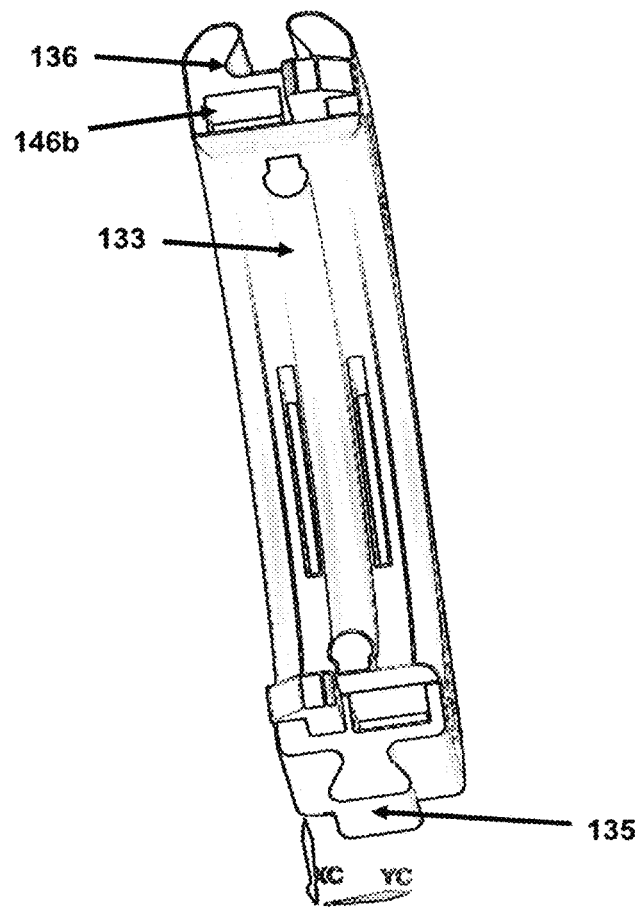
Figure 36:
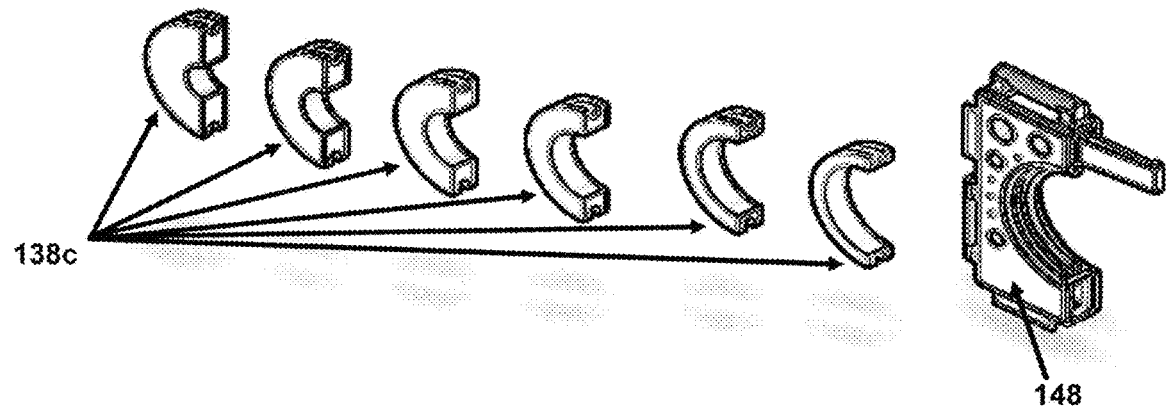
FIG. 36 illustrates a half smart clamp embodiment with different sizes of grip.
Figure 37:
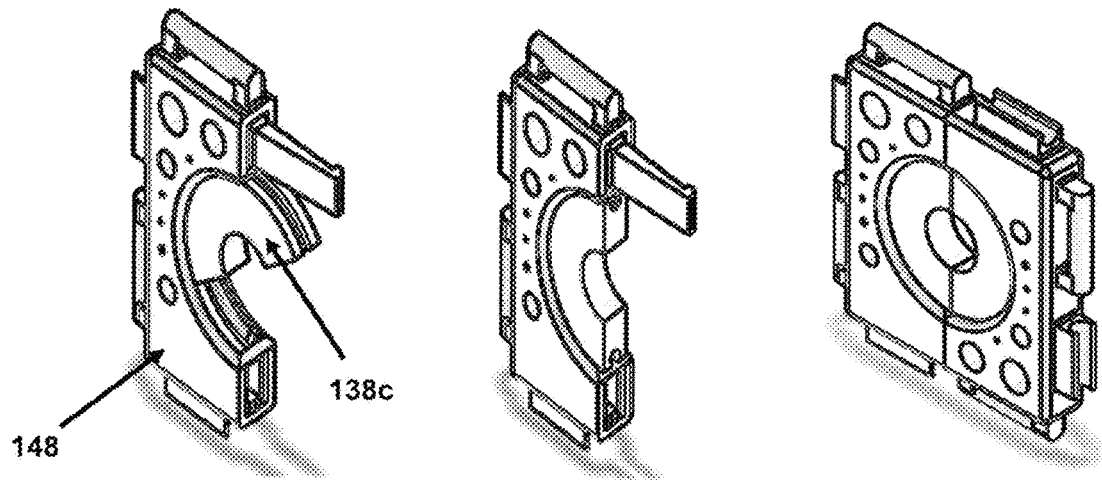
FIG. 37 illustrates a grip assembly.

The smart clamp assembly 131 may have a raised channel 135 on one side and a grove 136 on the opposite side that when slide together with a second half assembly it interlocks in place. The channel provides additional structural support 137 at a point of stress for the curved body. The inner side of the clamp assembly has a second raised channel 108 or 133 to fit a grip 138a, 138b, or 138c with an inner channel 139. The raised channel is preferably molded in a substantially semi-circular shape that is suited to receive a grip with inner channel that slides through with the aid of a fingertip of an individual pressing against it to bring the clamp and grip 123 together, FIG. 37. The semi-circular shape of the channel may also grant the additional advantage of allowing multiple size of grip devices, FIG. 36. The channel is designed to accommodate a grip, as described further in FIGS. 27 and 28.

The channel arm is tapered so that they are taller at one side 135 and form a depression 136 at the other side of the clamp assembly. The channel and grove are parallel to and face the outer surface of the curved body portion and together form a longitudinal channel for inter-connecting a secondary half clamp assembly.

Figure 25:
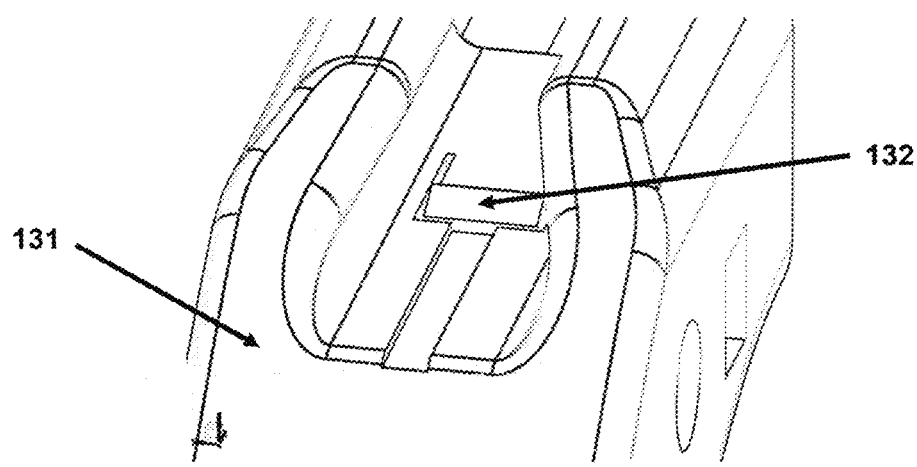
FIGS. 25 and 26 illustrate the latching mechanism of a half smart clamp embodiment.
Figure 26:
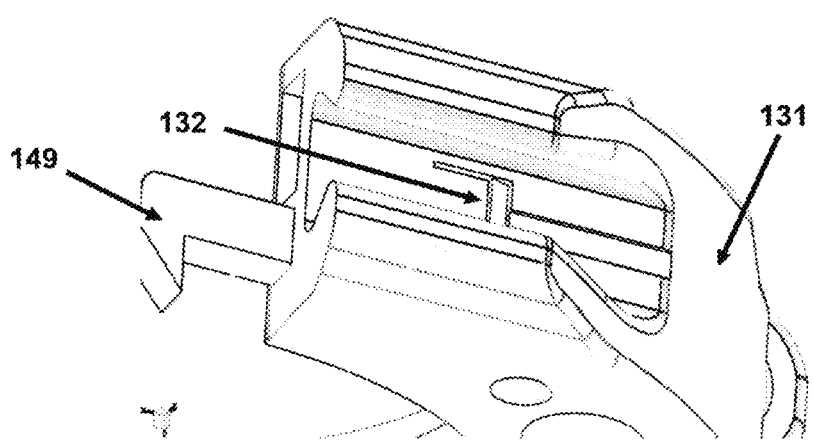
Figure 29:
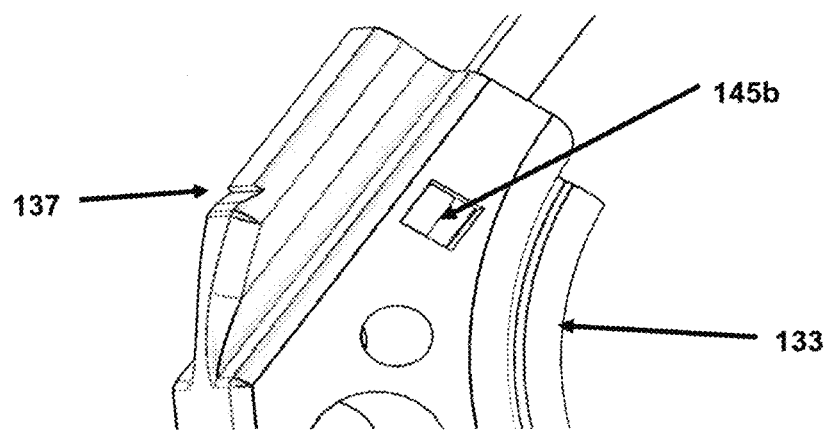
FIG. 29 illustrates the locking mechanism of the snap fit tabs from a half smart embodiment.
Figures 30A, 30B:
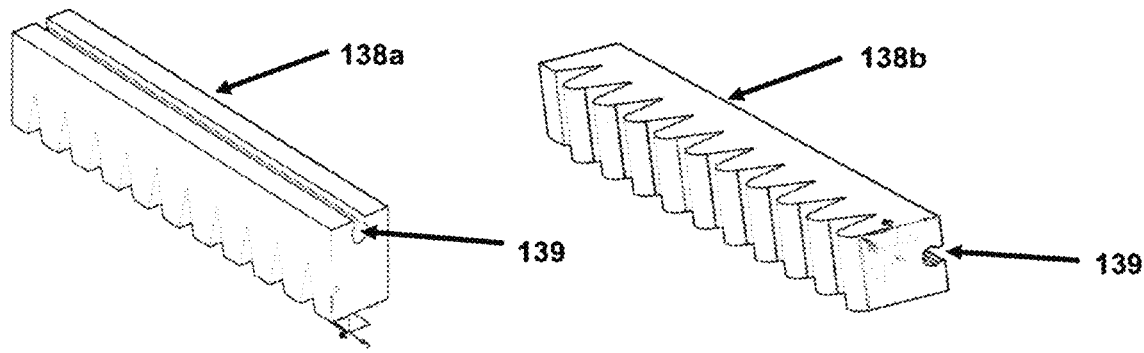
FIGS. 30a and 30b illustrate the grip strips with open channel for fitting unto a smart clamp embodiment.
Figure 31:
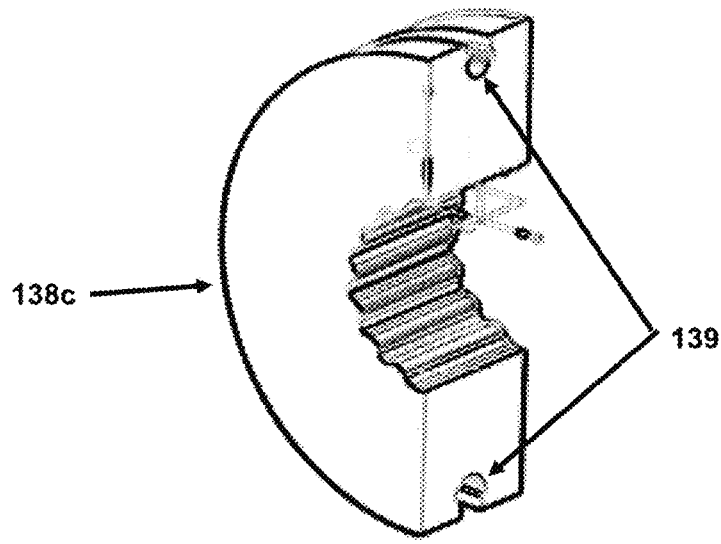
FIG. 31 illustrates a curved grip with open channel for fitting unto a smart clamp embodiment.
Figure 32:
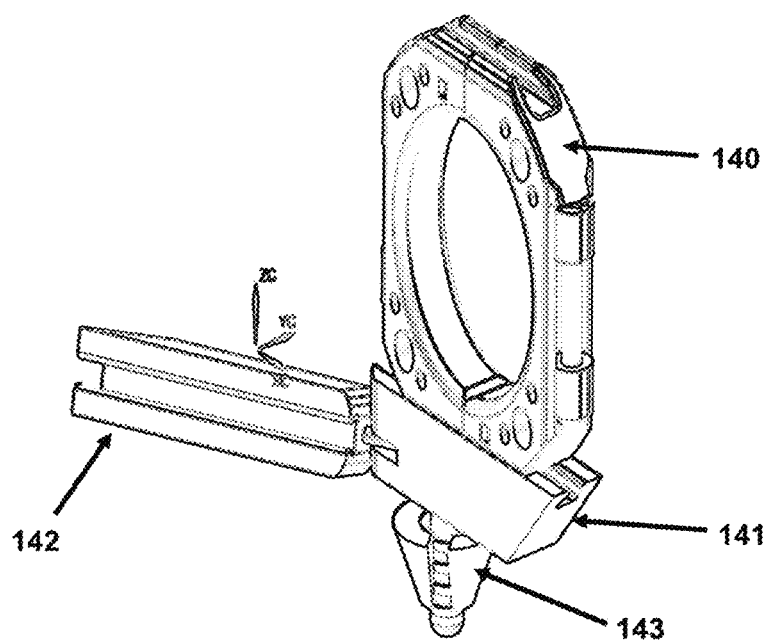
FIGS. 32 and 33 illustrate a fully assembled smart clamp embodiment mounted unto a base or mount body with pressure fastener and securing nonmetal nut.
Figure 33:
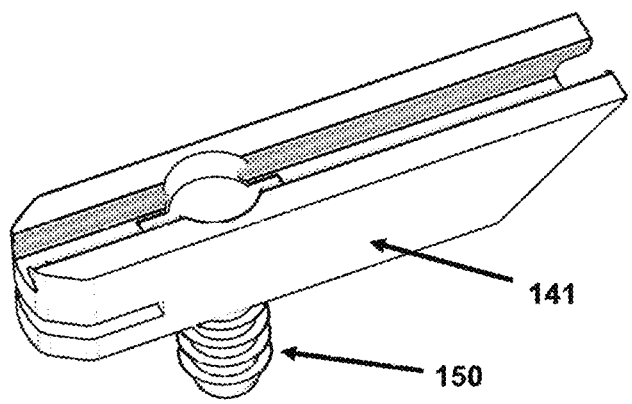
Figure 34:
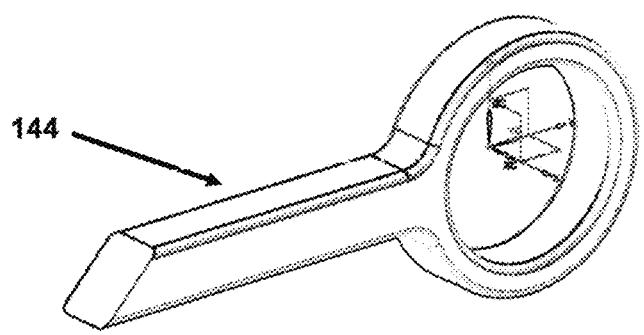
FIG. 34 illustrates a disassembly tool for unlatching another smart clamp embodiment.
Figure 35:
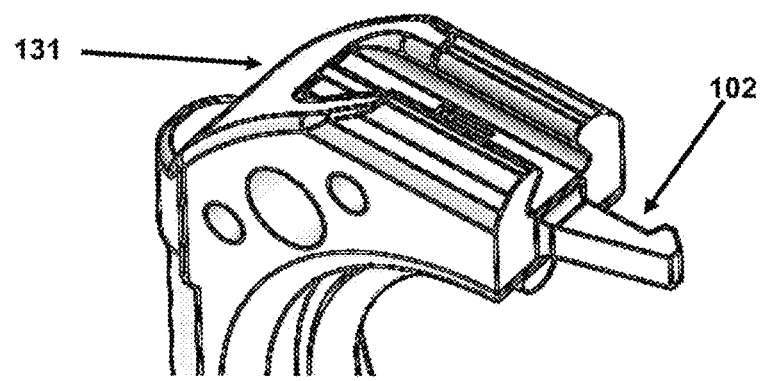
FIG. 35 illustrates another half smart clamp embodiment with snap fit tab.

At the grove portion or internal ramp, a notch with a snap-fit tab or lip 132 is designed to be complementary in shape to the locking support 137 to have a ramp and a flat section, FIGS. 25 and 26. The lip may be removed with a second disassembly tool 144. Accordingly, the ramp is angled downward toward the front of the second complementary half clamp assembly to form a receiving space, FIG. 29. The locking support slides along the ramp as the first half complementary clamp assembly is brought into contact with the second half complementary tab assembly. The notch is preferably at the distal end of the ramp. When the first half assembly and the second half assembly are brought together, the latch 132 slides into the notch 137, such that, when the first half assembly and the second half assembly are fully engaged, the locking tab assemblies are in an interlocked configuration, flush against one another. The latch engages the notch to cooperatively hold the clamp assemblies, together.

The grip 138a, 138b, or 138c may be molded from any plastic or rubber known in the art as long as the material is flexible enough to allow the curved body portion to flex and to permit support to the wire bundles there between, and also for the complementary snap-fit tab assembly 102 or 149 to come together and interlock with the second half complementary snap-fit tab assembly without deforming permanently. Exemplary types of plastic used may be polyethylene, polypropylene, polyvinyl, malemide, polyamide, polyaryletherketone and various plasticized combinations of such materials.

Grip material 123 for the smart clamp 120 should be soft enough so the material does not chafe into the wires that are being held in place, and hard enough so it can remain abrasion resistant. Grip material should be able to reduce noise due to surface contact and provide a strong grip. Grip material should meet the FAA regulations for flame, smoke, and toxicity and should remain an integral part of the smart clamp through required manufacturing, bonding or assembly processes. The grip material may be similar to the smart clamp material 148 or could be different to meet requirements of end use application and cost implications.

In one of the embodiments 140, the grip is mostly comprised of thermoplastics and thermoset materials.

Thermoplastics:
Silicone or blends: High temperature and chemical resistant, transparent, liquid injection overmolding on clamp or cut-to-size strip and bond to clamp body
Fluoroelastomers or blends: High temperature and chemical resistant, cut-to-size strip and bond to clamp body
Siltem or blends of material with siloxane in backbone of polymer chain: High temperature and chemical resistant, softness to reduce noise due to other surfaces, process through injection molding or extrusion
Thermoset:
Polyamide Imide: Higher curing for clamp body, local curing can be modified to achieve softness in grip and hardness in clamp
Epoxy or Polyamide with elastomer particles: Epoxy and dissolvable elastomer mixture is poured into a mold to form the clamp, the elastomer particles phase separate as the epoxy is being cured, the phase separation is designed such that the elastomer material migrated towards a desired location for the grip
Other Materials:
PolyMethyl Methacrylate (PMMA) as a base material. Fluorosilicone specifically Silastic FL 70-9201 made by Dow Corning was chosen for its weight, hardness, overmoldability, colorablity, and prior FAA approval.
The removal tool materials 111, 112, 113, and 114 may be PMMA, silicone, and aluminum 6061.

In one of the embodiments, the smart clamp is mostly comprised of thermoplastics and thermoset materials.

Thermoplastics:
Polyetherimide (Ultem) or blends: FAA approved, high temperature and chemical resistant
Polycarbonate (Lexan FST) or blends: FAA approved, transparent
Thermoset:
Polyamide Imide: Higher curing for clamp body
Epoxy or Polyamide with elastomer particles: Epoxy and dissolvable elastomer mixture is poured into a mold to form the clamp, the elastomer particles phase separate as the epoxy is being cured. The phase separation is designed such that the elastomer material migrated towards a desired location for grip It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the claims.

Figure 4:
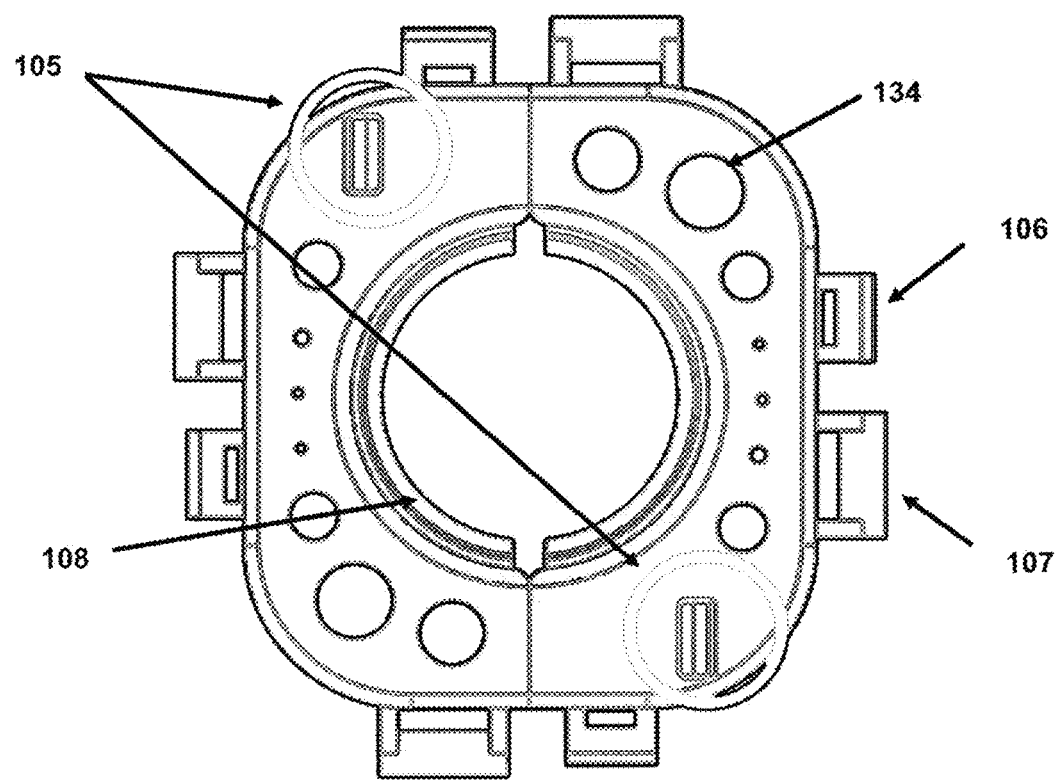
FIG. 4 illustrates two half assemblies brought together by a snap fit mechanism.
Figure 5:
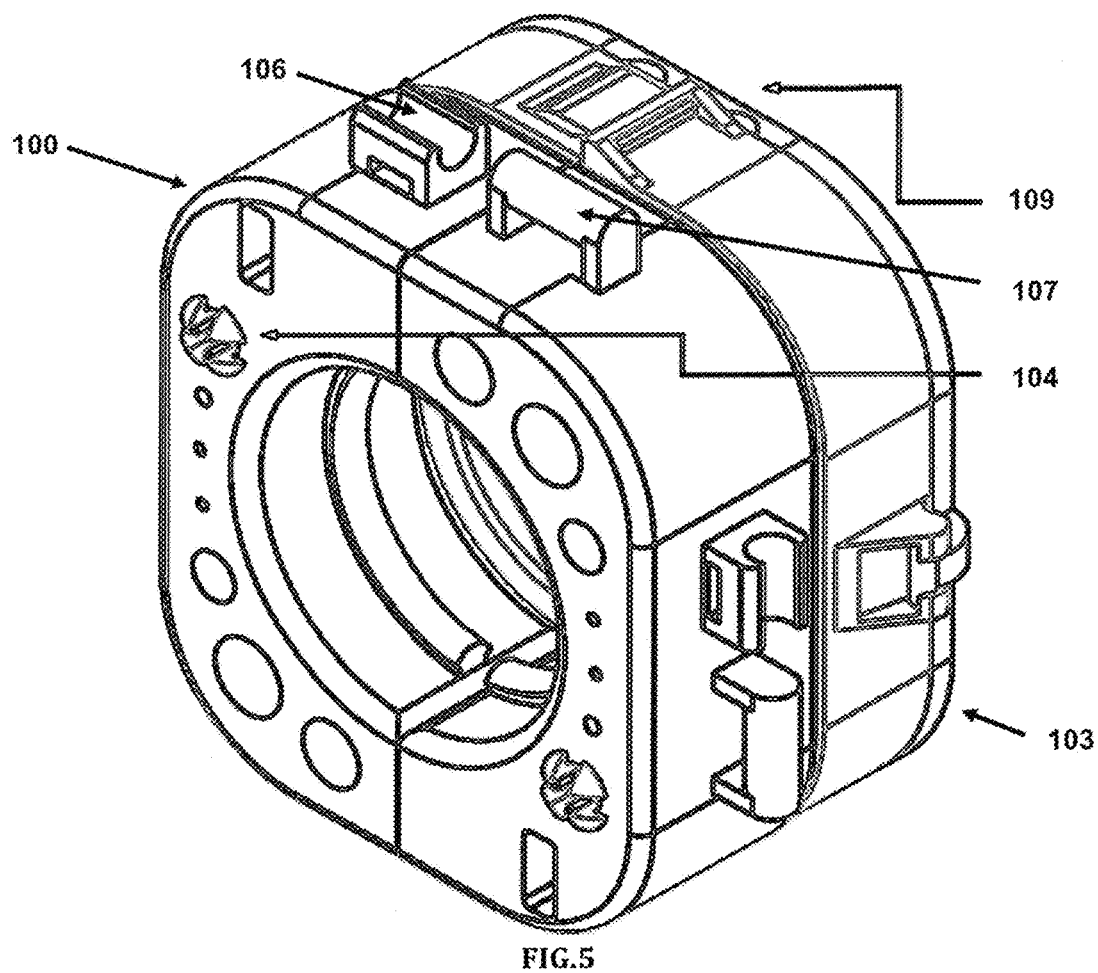
FIG. 5 is a diagram of an exemplary smart clamp assembly with electronic compartment assembly attached.

In one embodiment, a clip 106 or 124 being a friction fit that would use a rod 107 or 121 to latch unto and would comprise of one of each on every side, as seen in FIGS. 4 and 5. This design provides rotation motion on each side of the clamp, along with being symmetrical. The design relies on frictional force to keep it in place once the rod has been placed in the clip. A mount assembly 141 and 142 with pressure fastener 150 and nonmetallic nut 143 are available to secure the smart clamp further to other frames.

Component Sensor

While the device may be susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

Figure 17:
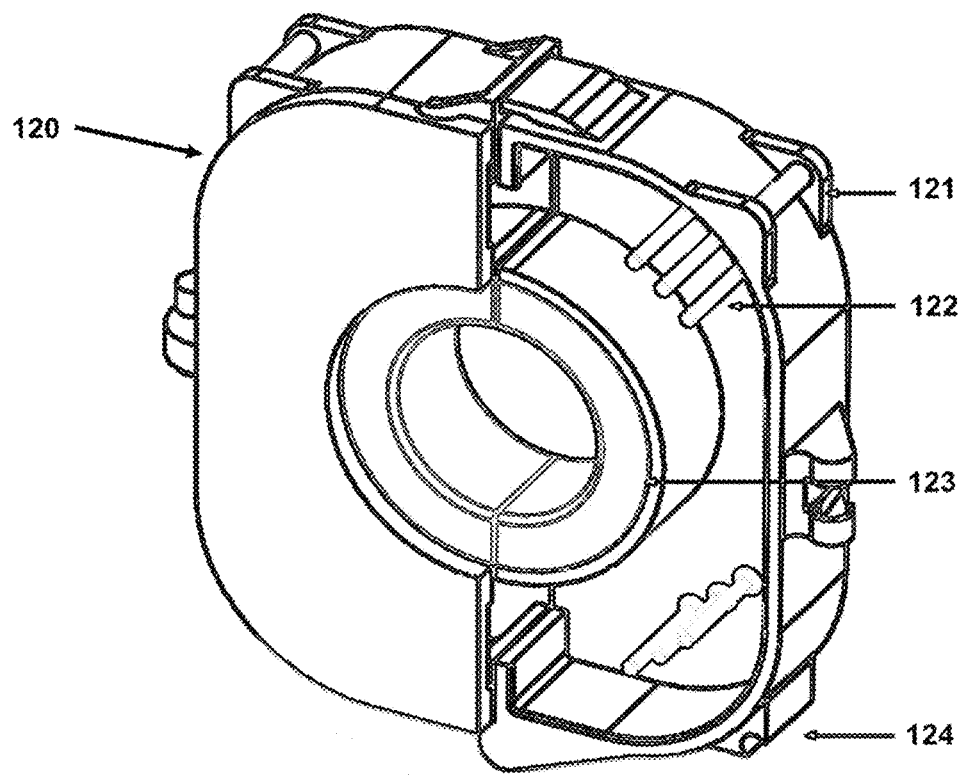
FIG. 17 illustrates a smart clamp with grip and a cross section showing the reinforced posts for sustaining an amperage core sensor.
Figure 18:
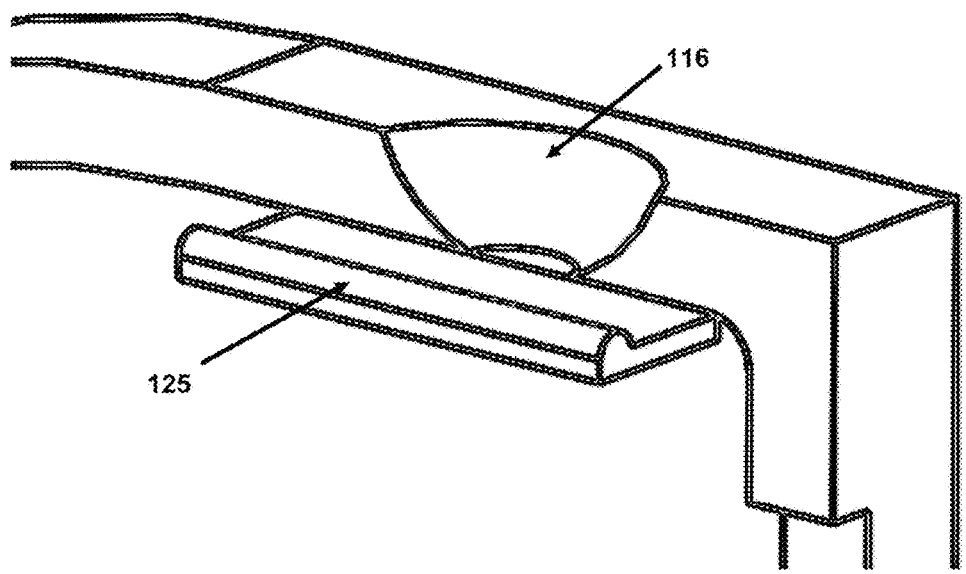
FIG. 18 illustrates the electronic compartment lid release mechanism.
Figure 19:
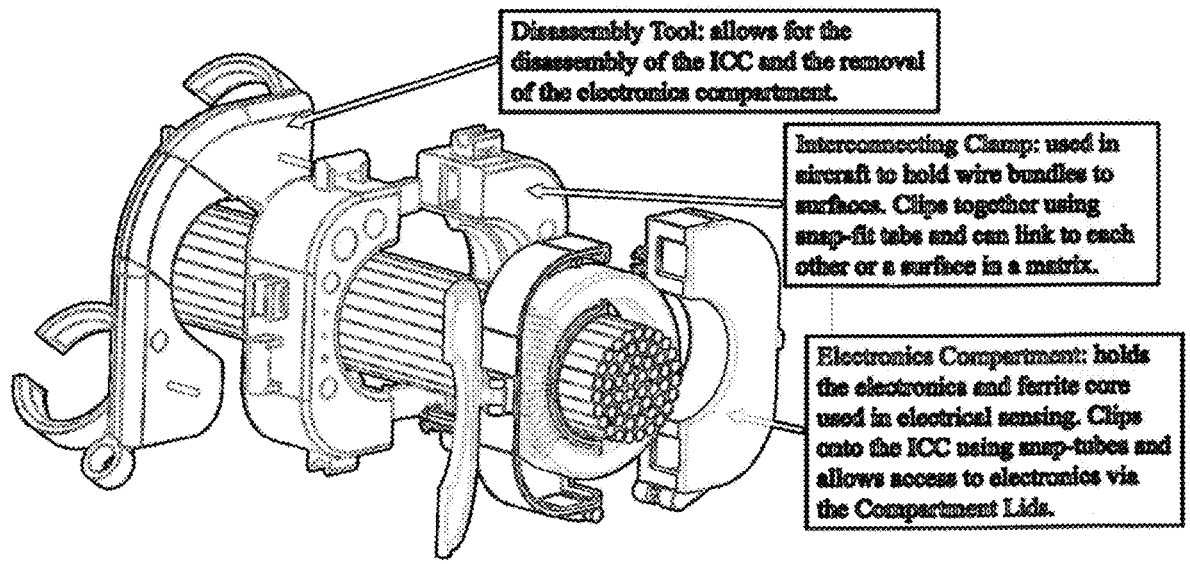
FIG. 19 is a diagram of an exemplary smart clamp assembly with electronic compartment for sensor and disassembly tool.
Figure 20:
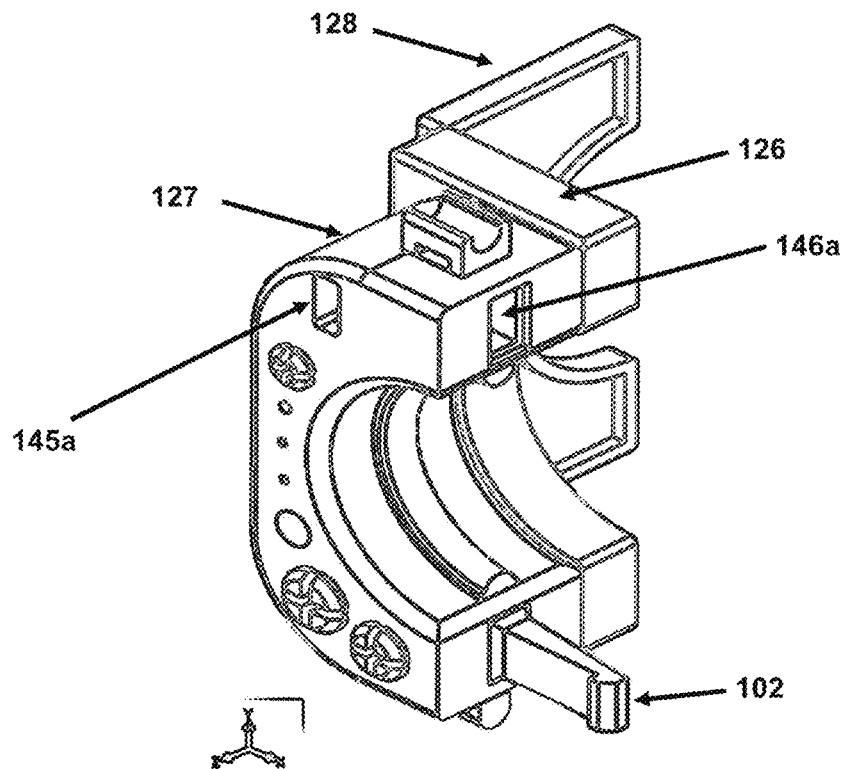
FIG. 20 is a diagram of an exemplary half smart clamp assembly with secondary electronic compartment for sensor attached.
Figure 21:
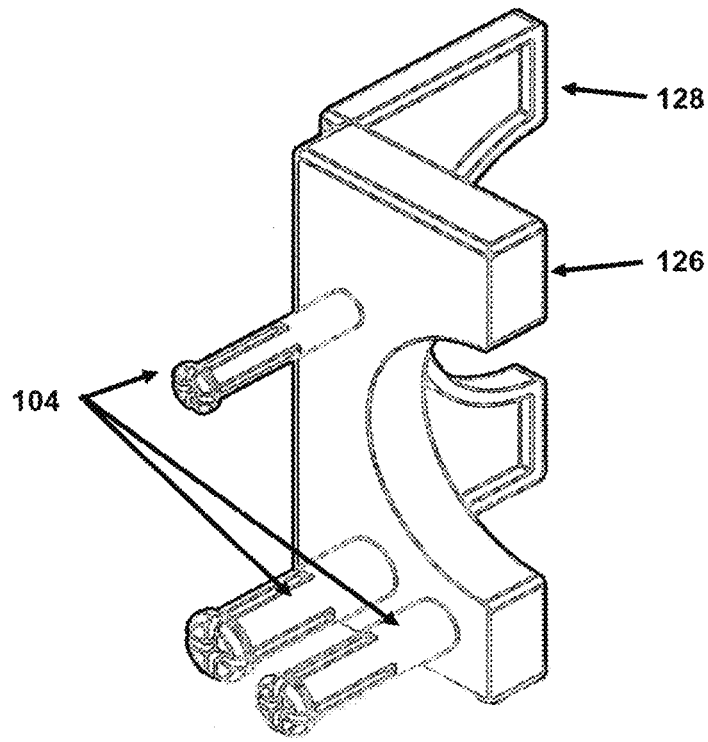
FIG. 21 is a diagram of secondary electronic compartment for sensor.
Figure 22:
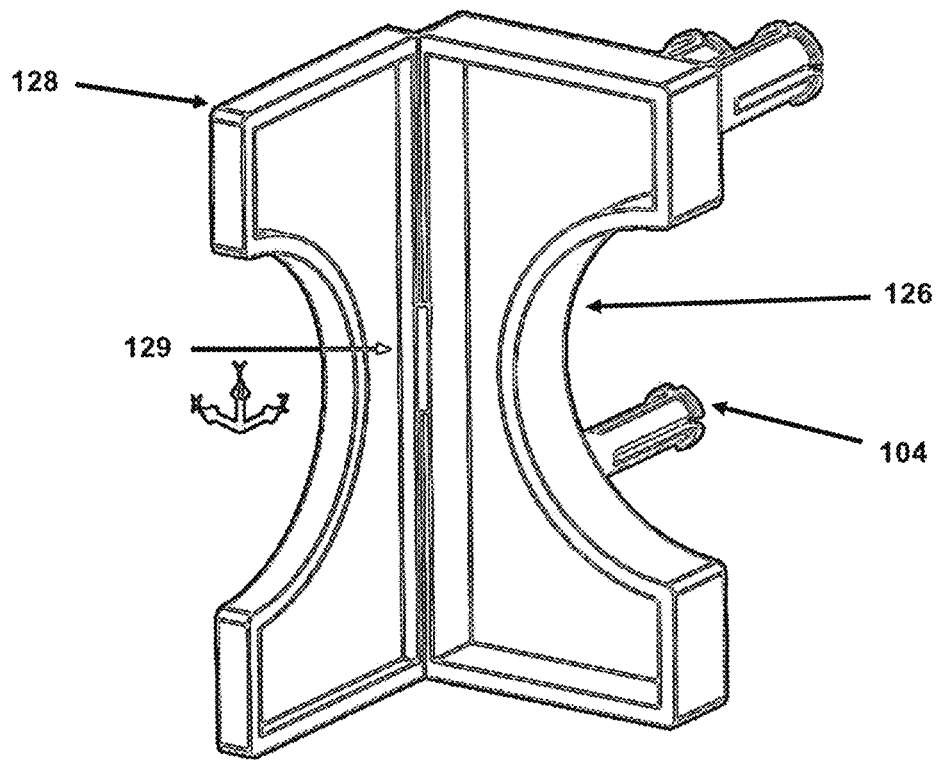
FIG. 22 is a diagram of secondary electronic compartment for sensor with open lid and tubular snap fit tabs.
Figure 23:
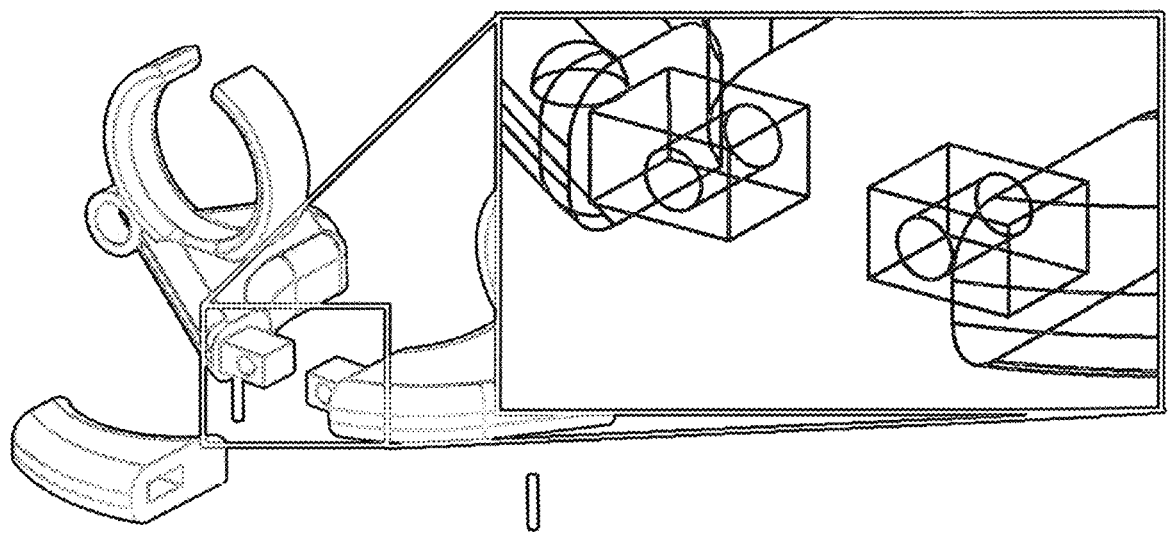
FIG. 23 is a diagram of the disassembly tool broken down into its different components.

A sensing device is disposed inside the smart clamp housing assembly, FIG. 19, external, or inside the grip. In one embodiment, the sensing device may comprise electrical leads that extend within the housing to terminal access points. In another embodiment, the interior of the housing assembly may be filled with an insulated filler material which serves to secure internal components, such as the aforementioned sensing device and its electrical leads, and to structurally support in addition to the posts 122, the distal end portion and the proximal end portion of the housing assembly FIG. 17. The filler material may include, for particular applications, plastic, elastomer, glass, rubber, other suitably electrically insulated or electrically non-conductive material, or combinations thereof.

The electrical leads may be connected to a wireless device that sends a signal to a control module for adjusting operating parameters in response and comprises a display gauge for displaying a numerical magnitude of a parameter, such as temperature, measured and transmitted by the sensing device. For example, if the sensing device is a thermistor, then the gauge may be a temperature gauge displaying a temperature reading transmitted by the thermistor over the wireless device.

Figure 6:
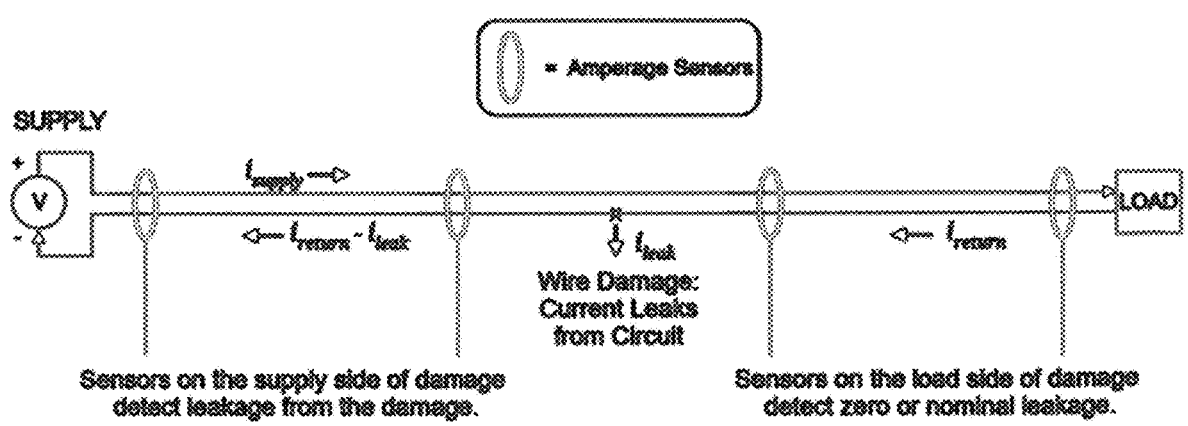
FIG. 6 illustrates a flowchart of a working method of exemplary sensor assemblies of FIG. 19.

There are industry standards for acceptable leakage current, which range from 0.25 mA to 3.5 mA depending upon whether the device is handheld and/or grounded. FIG. 6 shows a layout of how leakage current can be used to detect and locate problems in an aircraft circuit by the use of multiple smart clamps with amperage sensors FIG. 19. Having an amperage sensor that can detect less than 0.1 mA would give a low enough range to detect problems in circuits without much leakage current. The idea being, any change in leakage current from a calibrated nominal level could be indicative of wire damage/wear or another problem with the devices on the circuit. It is also important to consider the timing of the sampling and the size of the sensor.

A sensor is installed within. The presence of the grip prevents any risk of damage to the wires should they become trapped as the device is being locked for testing. Further modifications and alternative embodiments of various aspects of the invention will be apparent to those skilled in the art in view of this description. Accordingly, this description is to be construed as illustrative only and is for the purpose of depicting the general manner of carrying out the invention.

The smart clamp is assembled by the use of snap-fit tabs 102 and 149 in a fully assembled device due to external forces. Each sensor designed for the detection of specific elements give the clamp a color coded functionality and, more particularly, the electronic modules are presented for purposes of illustration and description only. It is not intended to be exhaustive or to limit the embodiments to the precise form disclosed.

Figure 14:
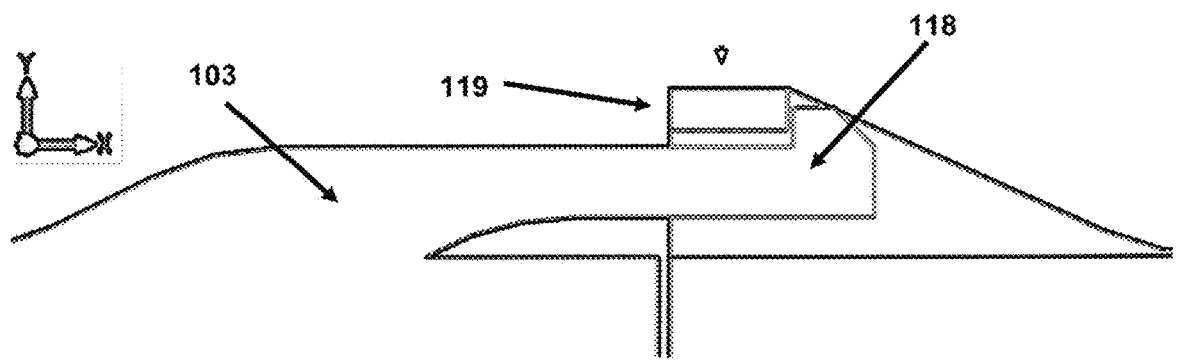
FIG. 14 illustrates the latch used to secure the electronic compartment.
Figure 15:
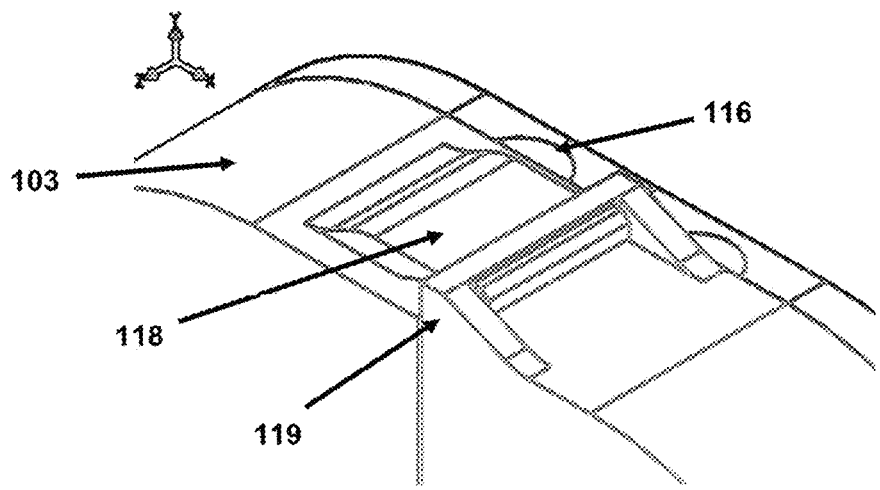
FIG. 15 illustrates the lid and latch used to secure the electronic compartment.
Figure 16:
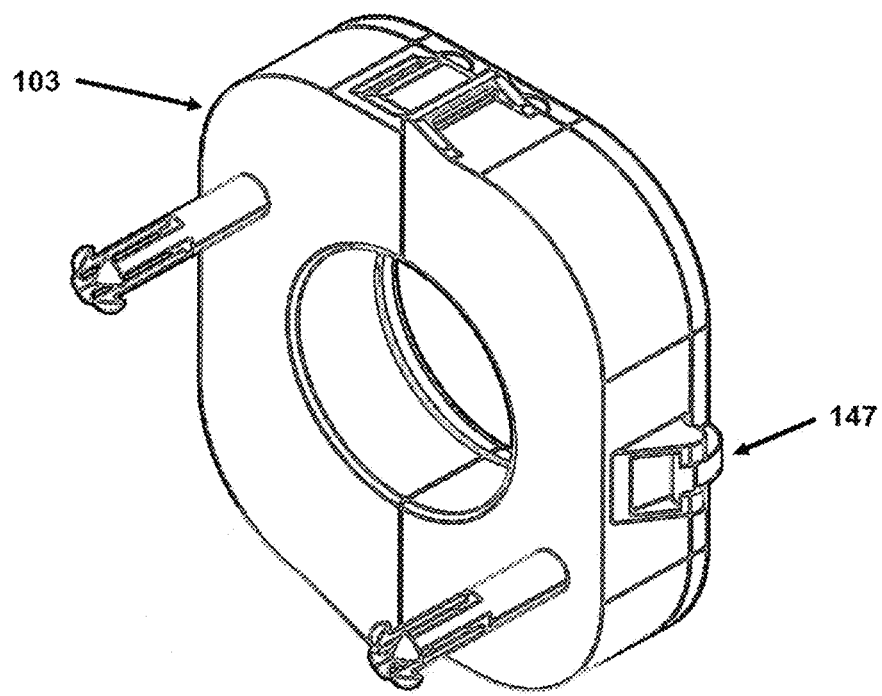
FIG. 16 illustrates an electronic compartment with tubular snap fits for mounting unto smart clamp with hinge for lid design.

The Electronic Compartment 103 or 123 is comprised of a set of snap tubes that provide a connection to the smart clamp. Access to the electronics is accomplished by the use of a lid 109 or 128 with a fingertip orifice 116 and lip 125 that revolves around a hinge 117, 129 and 147. The first half 118 tab of an Electronic Compartment fits in a second half body's depression and forms a locking support 119 as a latching mechanism, FIGS. 14 and 15.

Obvious modifications and variations are possible in light of obtaining a quality product. All such modifications and variations are within the scope of the appended claims when interpreted in accordance with the breadth to which they are fairly, legally and equitably entitled.

CONCLUSION

The disclosed embodiments are illustrative, not restrictive. While specific configurations of the smart clamp have been described, it is understood that the present invention can be applied to a wide variety of technical disciplines. There are many alternative ways of implementing the invention. The invention may be configured in a variety of shapes and sizes and is not intended to be limited by the embodiments. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

What is claimed is:

1. A device for securing aircraft wiring, monitoring the aircraft wiring, and detecting degradation of the aircraft wiring, the device comprising:
    a first clamp body having a first end, a second end opposite the first end, a concave portion extending semi-annularly between the first end and the second end, a first exterior surface, a second exterior surface opposite the first exterior surface, and a first attachment element, the first attachment element including a hole through the first exterior surface and the second exterior surface, the concave portion configured to at least partially define a wire-receiving space;
    an electronics housing configured to be attached to the first clamp body;
    a sensing device supported by at least one of the first clamp body and the electronics housing, the sensing device configured to sense a characteristic of the aircraft wiring indicative of integrity of the aircraft wiring; and
    a communication module configured to communicate data from the sensing device to a receiver, the communication module supported by the electronics housing.

2. The device of claim 1, wherein the electronics housing has a first electronics housing portion with a first end, a second end opposite the first end, a concave portion extending semi-annularly between the first end and the second end, and a first exterior surface, the concave portion configured to at least partially define a wire-receiving space.

3. The device of claim 2, wherein the first electronics housing portion further comprises a second exterior surface opposite the first exterior surface of the first electronics housing portion, the first exterior surface of the first electronics housing portion, the second exterior surface of the first electronics housing portion, and the concave portion defining a hollow space therebetween.

4. The device of claim 3, wherein the second exterior surface of the first electronics housing portion is configured to be moved between an open position enabling access to the hollow space and a closed position preventing access to the hollow space.

5. The device of claim 2, wherein the first exterior surface of the first electronics housing portion is flat and the first exterior surface of the first clamp body is flat.

6. The device of claim 2, wherein the first exterior surface of the first electronics housing portion has a shape congruent with the first exterior surface of the first clamp body.

7. The device of claim 2, wherein the electronics housing has a second electronics housing portion with a first end, a second end opposite the first end of the second electronics housing portion, a concave portion extending semi-annularly between the first end of the second electronics housing portion and the second end of the second electronics housing portion, and a first exterior surface, the concave portion of the second electronics housing portion configured to at least partially define the wire-receiving space, the second electronics housing portion configured to connect to the first electronics housing portion.

8. The device of claim 7, wherein the first electronics housing portion includes an elastically deformable retention tab with a latch, and the second electronics housing portion includes a receiving element to accept insertion of the elastically deformable retention tab, wherein the insertion of the elastically deformable retention tab and the latch into the receiving element removably locks the first electronics housing portion to the second electronics housing portion.

9. The device of claim 1, wherein the electronics housing includes a second attachment element on the exterior surface of the electronics housing, the second attachment element including a shaft extending from the exterior surface and terminating with snap-fit tabs, the shaft being configured to fit through the hole, the snap-fit tabs biased toward a first position with an outermost diameter greater than an outermost diameter of the hole, the snap-fit tabs configured to be elastically compressed to a second position with an outermost diameter less than the outermost diameter of the hole.

10. The device of claim 1, wherein the electronics housing further comprises a lid, the lid including a hinge.

11. The device of claim 10, wherein the lid includes a snap clip to releasably lock the lid in a closed position.

12. The device of claim 1, wherein the first clamp body and the electronics housing are each made from thermoplastic materials.

13. The device according to claim 1, wherein the communication module is configured to communicate via Bluetooth or radio frequency identification.

14. The device according to claim 1, further comprising an energy harvester supported by the first clamp body or the electronics housing, the energy harvester configured to supply electricity to the communication module.

15. The device according to claim 14, further comprising one or more of a passive radio frequency identification based microcontroller, an antenna, an active radio frequency identification device with power management and an antenna, and a radio frequency identification analog sensor reader.

16. The device according to claim 1, wherein the sensing device includes at least one of a sensor for gas, metal, pressure, temperature, amperage, and electromagnetic detection, an amperage sensor including a custom split current transformer, and an amplifier that measures leakage current.

17. The device according to claim 14, wherein the energy harvester is configured to obtain energy from an electromagnetic source or from aircraft vibration.

18. The device according to claim 14, wherein the energy harvester includes a linear voltage regulator with a capacitor and with a capacitance value configured to harvest and store energy for use when a desired voltage is across the capacitor.

19. A device for securing aircraft wiring, monitoring the aircraft wiring, and detecting degradation of the aircraft wiring, the device comprising:

a first clamp body having a first end, a second end opposite the first end, a concave portion extending semi-annularly between the first end and the second end, a first exterior surface, and a second exterior surface opposite the first exterior surface, the concave portion configured to at least partially define a wire-receiving space;

an electronics housing configured to be attached to the first clamp body, the electronics housing having:

a first electronics housing portion with a first end, a second end opposite the first end, a concave portion extending semi-annularly between the first end and the second end, and a first exterior surface, the concave portion configured to at least partially define a wire-receiving space, a second electronics housing portion with a first end, a second end opposite the first end of the second electronics housing portion, a concave portion extending semi-annularly between the first end of the second electronics housing portion and the second end of the second electronics housing portion, and a first exterior surface, the concave portion of the second electronics housing portion configured to at least partially define the wire-receiving space, the second electronics housing portion configured to connect to the first electronics housing portion, wherein the first electronics housing portion includes an elastically deformable retention tab with a latch, and the second electronics housing portion includes a receiving element to accept insertion of the elastically deformable retention tab, wherein the insertion of the elastically deformable retention tab and the latch into the receiving element removably locks the first electronics housing portion to the second electronics housing portion;

a sensing device supported by at least one of the first clamp body and the electronics housing, the sensing device configured to sense a characteristic of the aircraft wiring indicative of integrity of the aircraft wiring; and a communication module configured to communicate data from the sensing device to a receiver, the communication module supported by the electronics housing.

\* \* \* \* \*